(12) United States Patent
Cheng

(10) Patent No.: US 11,088,183 B2
(45) Date of Patent: Aug. 10, 2021

(54) MANUFACTURING METHOD OF LOW TEMPERATURE POLY-SILICON (LTPS) THIN FILM TRANSISTOR (TFT) SUBSTRATE AND THE LTPS TFT SUBSTRATE

(71) Applicant: Wuhan China Star Optoelectronics Technology Co., Ltd., Wuhan (CN)

(72) Inventor: Tao Cheng, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 373 days.

(21) Appl. No.: 16/309,445

(22) PCT Filed: Sep. 22, 2018

(86) PCT No.: PCT/CN2018/107138
§ 371 (c)(1),
(2) Date: Dec. 12, 2018

(87) PCT Pub. No.: WO2019/227790
PCT Pub. Date: Dec. 5, 2019

(65) Prior Publication Data
US 2021/0118911 A1    Apr. 22, 2021

(30) Foreign Application Priority Data
May 31, 2018  (CN) .......................... 201810546898.0

(51) Int. Cl.
*H01L 27/12* (2006.01)
*H01L 21/28* (2006.01)
(Continued)

(52) U.S. Cl.
CPC ...... *H01L 27/127* (2013.01); *H01L 21/28158* (2013.01); *H01L 21/3115* (2013.01);
(Continued)

(58) Field of Classification Search
CPC ............... H01L 27/127; H01L 21/3115; H01L 29/66757; H01L 27/1222; H01L 29/78675; H01L 29/4908; H01L 21/28158
See application file for complete search history.

(56) References Cited

U.S. PATENT DOCUMENTS 6,639,279 B1 * 10/2003 Sung .................. H01L 29/4908
257/288
2007/0093004 A1    4/2007 Park
(Continued)

FOREIGN PATENT DOCUMENTS

CN       101789434 A     7/2010
CN       103972070 A     8/2014
(Continued)

OTHER PUBLICATIONS

CN publication 103972070A (Translation) (Year: 2014).*

*Primary Examiner* — Mohammed R Alam
(74) *Attorney, Agent, or Firm* — Leong C. Lei

(57) ABSTRACT

The present disclosure relates to a manufacturing method of LTPS TFT substrate and the LTPS TFT substrate. With respect to the manufacturing method, after the gate insulation layer is formed, the gate insulation layer is doped with nitrogen by a plasma containing nitrogen so as to increase the positive charges within the gate insulation layer. As such, the P-type TFT threshold voltage can be negatively shifted so as to enhance the splash screen issue.

10 Claims, 2 Drawing Sheets

(51) Int. Cl.
   *H01L 21/3115*   (2006.01)
   *H01L 29/49*     (2006.01)
   *H01L 29/66*     (2006.01)
   *H01L 29/786*    (2006.01)

(52) U.S. Cl.
   CPC ...... *H01L 27/1222* (2013.01); *H01L 29/4908* (2013.01); *H01L 29/66757* (2013.01); *H01L 29/78675* (2013.01)

(56) References Cited

U.S. PATENT DOCUMENTS

2007/0111458 A1* 5/2007 Sato .................. H01L 21/02332
                                                         438/308
2010/0244037 A1* 9/2010 Shiota ............... H01L 29/78618
                                                         257/72
2019/0221672 A1* 7/2019 Xiao ................. H01L 21/28167

FOREIGN PATENT DOCUMENTS

CN      104966698 A    10/2015
CN      105097544 A    11/2015

* cited by examiner

MANUFACTURING METHOD OF LOW TEMPERATURE POLY-SILICON (LTPS) THIN FILM TRANSISTOR (TFT) SUBSTRATE AND THE LTPS TFT SUBSTRATE

FIELD OF THE INVENTION

The present disclosure relates to a display technology field, and more particularly to a manufacturing method of Low Temperature Poly-silicon (LTPS) thin film transistor (TFT) substrates and the LTPS TFT substrates.

BACKGROUND OF THE INVENTION

In the field of display technology, flat panel display devices, such as liquid crystal displays (LCDs) and active matrix organic light-emitting diode (AMOLED) displays, are characterized by attributes, such as thin, high performance, power saving, and no-radiation, and thus have been adopted by a wide range of applications, including mobile phone, personal digital assistant (PDA), digital camera, computer screen or notebook screen.

TFT array substrate is a major component of current LCD devices and AMOLED devices, and is directly related to the development of high-performance flat panel display devices for providing driving circuits to displays. Generally, a plurality of gate scan lines and a plurality of data lines are disposed. The plurality of gate scan lines and the plurality of data lines define a plurality of pixel units, and each of the pixel units is provided with a TFT and a pixel electrode. A gate of the TFT connects to the corresponding gate scan line. When the voltage on the gate scan line reaches the turn-on voltage, the source and drain of the TFTs are turned on, thereby inputting the data voltage on the data line to the pixel electrode so as to control the display of the pixel area. Generally, the structure of the TFT on the array substrate further includes a gate electrode, a gate insulation layer, an active layer, a source and a drain, and an insulating protective layer that are stacked on the substrate.

Compared to traditional A-Si TFTs, LTPS thin film transistors have higher carrier mobility, though the fabrication process is complicated. It is widely used in the production of small and medium-sized high-resolution LCD and AMOLED display panels. LTPS is regarded as an important material for realizing low-cost full-color flat panel display.

GOA (Gate Driver on Array) technology, that is, row driving technology, is a TFT array process to fabricate a gate scanning driving circuit on a TFT array substrate so as to realize a progressive scanning driving mode, which has a low production cost. The advantages of the panel's narrow bezel design are used for a variety of displays. The GOA circuit has two basic functions: the first is to output the gate scan drive signal, drive the gate line in the panel, turn on the TFT in the display area to charge the pixel; and the second is the shift register function. When the output of the gate scan drive signal is completed, the output of the next gate scan drive signal is controlled by clock, and is sequentially transmitted. GOA technology can reduce the bonding process of external ICs, increase the productivity and reduce the cost of products. Thus, LCD panels may be more suitable for making narrow-frame display products.

At present, Metal Oxide Semiconductor (MOS) devices are generally fabricated by LTPS, which are mainly classified into a Negative Channel Metal Oxide Semiconductor (NMOS) and a P-type Metal Oxide Semiconductor (Positive Channel Metal Oxide Semiconductor (PMOS), wherein the main difference between the NMOS transistor (N-type TFT) and the PMOS transistor (P-type TFT) is that the source-drain contact regions are heavily doped by N-type ions and heavily doped by P-type ions.

For a P-type TFT, when the voltage applied to the gate is less than the threshold voltage (VTH), the source and the drain are turned on. Therefore, the threshold voltage is an important parameter that determines the performance of the TFT. From the perspective of energy saving, the down-conversion driving mode of the IC chip is popular. However, when the P-type TFT Vth is large, the display panel may have a splash screen when the panel is driven down by the IC chip. This is attributed to the fact that the IC has no thrust on the GOA signals in the case of down-conversion, resulting in an increase in the turn-on voltage (VGH) and the turn-off voltage (VGL) voltage drop. During the period, the pixel leakage increases, which may result in crosstalk.

The above problem of the down-converted splash screen can be solved by adjusting the P-type TFT Vth, while improving the quality of the TFT device and saving energy.

SUMMARY OF THE INVENTION

The present disclosure relates to a manufacturing method of LTPS TFT for shifting a threshold voltage of a P-type TFT (P-VTH). Compared to the conventional solution, the P-VTH may be reduced from the maximum value, i.e., −1V, to −1.3V. This may eliminate the splash screen issue of the display panel.

In one aspect, a manufacturing method of Low Temperature Poly-silicon (LTPS) thin film transistor (TFT) substrates includes: S1: providing a base substrate, and forming a polysilicon active layer on the base substrate; S2: depositing a gate insulation layer on the base substrate and applying a nitrogen doping process using nitrogen-containing plasma toward the gate insulation layer, wherein the gate insulation layer covers the polysilicon active layer; and S3: forming a gate and a source/drain on the gate insulation layer.

Wherein the gate insulation layer is a silicon oxide layer.

Wherein in the step S2, at least one of ammonia ($NH_3$), nitrogen ($N_2$), and nitrous oxide ($NO_2$) is selected as a reactive gas in a Plasma Enhanced Chemical Vapor Deposition (PECVD) device so as to produce the nitrogen-containing plasma for the nitrogen doping process being applied to the gate insulation layer; and an electric power used by the PECVD device to perform the nitrogen doping process on the polysilicon active layer is in a range from 2000 to 10000 w, and the nitrogen doping process is applied to the gate insulation layer for a time period ranging from 10 to 120 seconds.

Wherein in the step S2, the ammonia ($NH_3$) is selected as the reactive gas in the PECVD device so as to produce the nitrogen-containing plasma; and the electric power used by the PECVD device to perform the nitrogen doping process on the polysilicon active layer is in a range from 6000 to 8000 w, and the nitrogen doping process is applied to the gate insulation layer for the time period ranging from 40 to 70 seconds.

Wherein before forming the source/drain, the step S3 further includes: forming through holes on the gate insulation layer, wherein the through holes corresponds to tops of two ends of the polysilicon active layer, and after the source/drain is formed, the source/drain contact with the polysilicon active layer via the through holes.

Wherein the step S1 or the step S3 further includes: applying a P-type ion doping to the polysilicon active layer.

Wherein the ions doped during the P-type ion doping are boron ions.

In another aspect, a LTPS TFT substrate includes: a base substrate, a polysilicon active layer on the base substrate, a gate insulation layer on the base substrate, and a gate and a source/drain on the gate insulation layer, wherein the gate insulation layer covers the polysilicon active layer; and the gate insulation layer being applied with a nitrogen doping process.

Wherein the gate insulation layer is a silicon oxide layer.

Wherein a P-type ion doping is applied to the polysilicon active layer; through holes corresponds to tops of two ends of the polysilicon active layer are configured on the gate insulation layer, and the source/drain contact with the polysilicon active layer via the through holes.

In view of the above, after the gate insulation layer is formed, the gate insulation layer is doped with nitrogen by a plasma containing nitrogen so as to increase the positive charges within the gate insulation layer. As such, the P-type TFT threshold voltage can be negatively shifted. Compared with the convention technology, the maximum value of the P-type TFT threshold voltage can be reduced from −1 V to −1.3 V, thereby improving the splash screen issue. With respect to the LTPS TFT substrate, the gate insulation layer is subjected to the nitrogen-doping process, thereby enabling the P-type TFT threshold voltage to be negatively shifted, and the maximum value of the P-type TFT threshold voltage can be reduced from −1 V to −1.3 V, when being compared to the conventional technology. In turn, the splash screen issue of the display panel can be improved.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
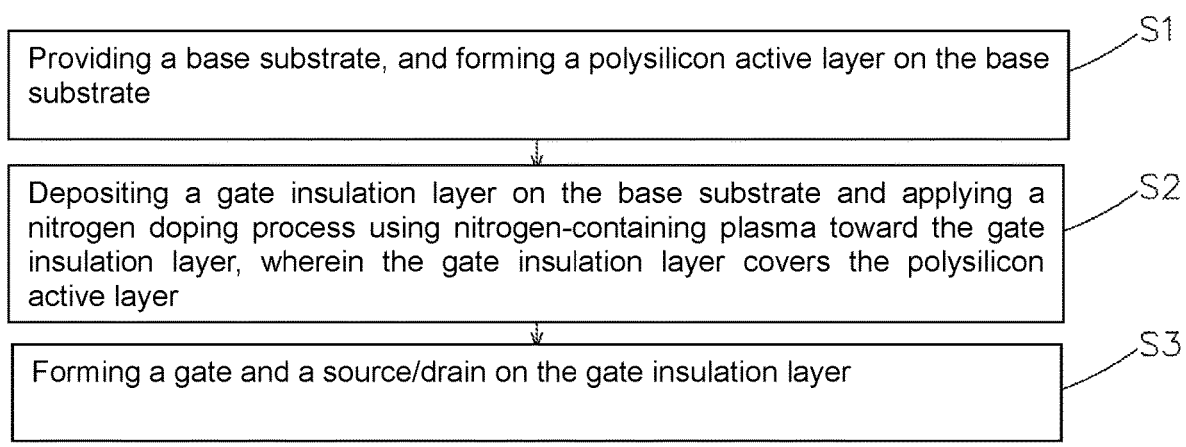
FIG. 1 is a flowchart illustrating the manufacturing method of the LTPS TFT substrate in accordance with one embodiment of the present disclosure.

FIG. 1 is a flowchart illustrating the manufacturing method of the LTPS TFT substrate in accordance with one embodiment of the present disclosure. The manufacturing method includes the following steps.

Figure 2:
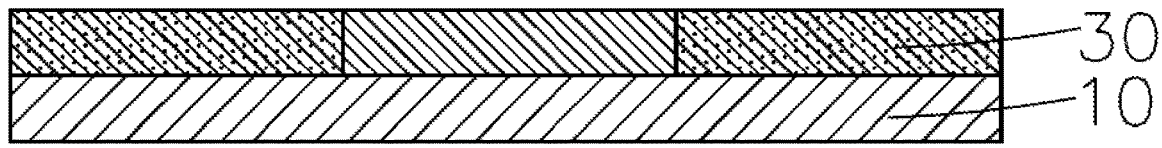
FIG. 2 is a schematic view showing the step S1 of the manufacturing method of the LTPS TFT substrate in accordance with one embodiment of the present disclosure.

In step S1, as shown in FIG. 2, providing a base substrate 10, and forming a polysilicon active layer 30 on the base substrate 10.

Figure 3:
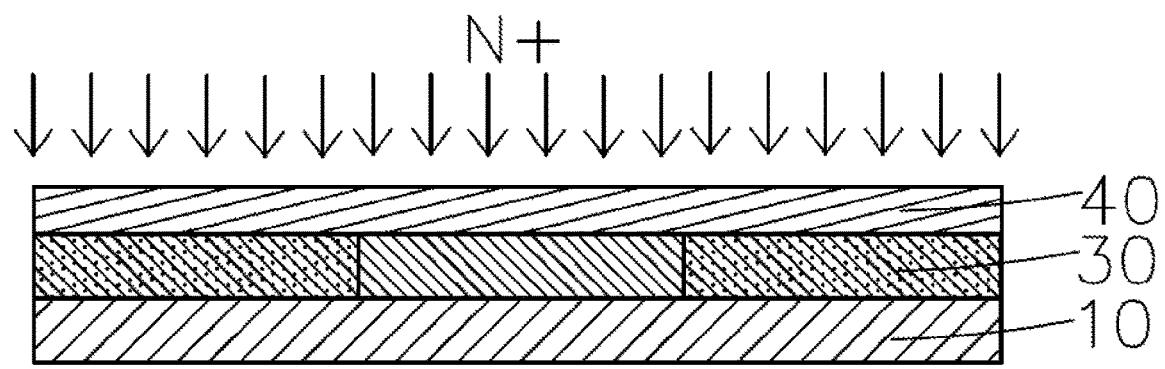
FIG. 3 is a schematic view showing the step S2 of the manufacturing method of the LTPS TFT substrate in accordance with one embodiment of the present disclosure.

In step S2, as shown in FIG. 3, depositing a gate insulation layer 40 on the base substrate 10 and applying a nitrogen doping process using nitrogen-containing plasma toward the gate insulation layer 40, wherein the gate insulation layer 40 covers the polysilicon active layer 30.

Figure 4:
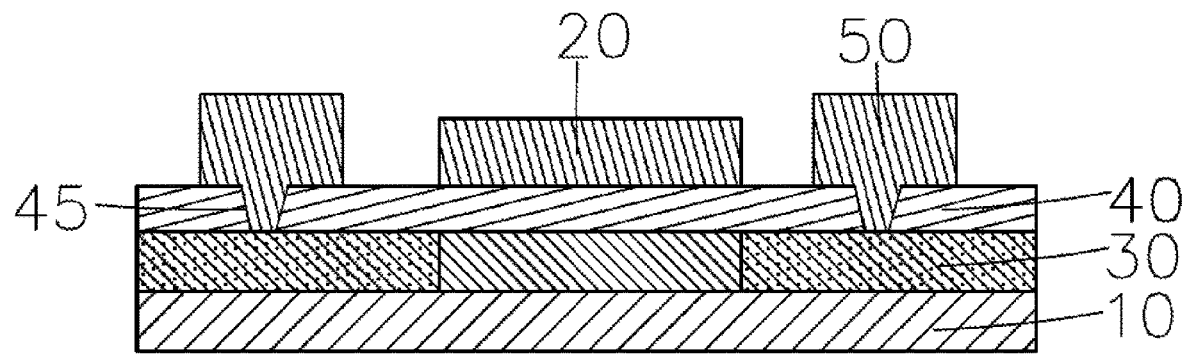
FIG. 4 is a schematic view showing the step S3 of the manufacturing method of the LTPS TFT substrate and the structure of the LTPS TFT substrate in accordance with one embodiment of the present disclosure.

In step S3, as shown in FIG. 4, forming a gate 20 and a source/drain 50 on the gate insulation layer 40 to obtain the TFT.

In an embodiment, the gate insulation layer 40 is a silicon oxide layer.

Specifically, in the step S2, at least one of ammonia ($NH_3$), nitrogen ($N_2$), and nitrous oxide ($NO_2$) is used as a reactive gas in a PETCVD (Plasma Enhanced Chemical Vapor Deposition) device so as to produce the nitrogen-containing plasma. With that, the nitrogen doping process is applied to the gate insulation layer 40.

Preferably, in the step S2, ammonia gas is used as a reaction gas to form the nitrogen-containing plasma in the PECVD device.

Specifically, in the step S2, the electric power used by the PECVD device to perform the nitrogen doping process on the polysilicon active layer 30 is 2000-10000 w. In an example, the electric power may be 6000-8000 w. The nitrogen doping process may be applied to the gate insulation layer 40 for a period ranging from 10 to 120 seconds. In another example, the nitrogen doping process may be applied to the gate insulation layer 40 for a period ranging from 40 to 70 seconds.

In one embodiment, before forming the source/drain 50, the step S3 further includes: forming through holes 45 on the gate insulation layer 40, wherein the through holes 45 corresponds to tops of two ends of the polysilicon active layer 30. After the source/drain 50 is formed, the source/drain 50 contact with the polysilicon active layer 30 via the through holes 45.

In an example, the step S1 or the step S3 further includes: applying a P-type ion doping on the polysilicon active layer 30 so as to form the P-type TFT structure.

In an example, the ions doped during the P-type ion doping are boron ions.

The present disclosure verifies the technical effects by the following experiments:

First Experiment

Using $NH_3$ and $N_2$ as reaction gases to form a nitrogen-containing plasma in the PECVD device. The gate insulation layer 40 of the silicon oxide layer is subjected to the nitrogen doping process. The electric power used in the PECVD device is 6000 W, and the time period of the nitrogen doping process is 55 seconds. The result is a negative shift of the P-Vth, and the P-Vth distribution interval is −2.61 to −1.31V.

Second Experiment

Using $NH_3$ and $N_2$ as reaction gases to form a nitrogen-containing plasma in the PECVD device. The gate insulation layer 40 of the silicon oxide layer is subjected to the nitrogen doping process. The electric power used in the PECVD device is 7000 W, and the time period of the nitrogen doping process is 55 seconds. The result is a negative shift of the P-Vth, and the P-Vth distribution interval is −2.48 to −1.23V.

Third Experiment

Using $NH_3$ and $N_2$ as reaction gases to form a nitrogen-containing plasma in the PECVD device. The gate insulation layer 40 of the silicon oxide layer is subjected to the nitrogen doping process. The electric power used in the PECVD device is 8000 W, and the time period of the nitrogen doping process is 55 seconds. The result is a negative shift of the P-Vth, and the P-Vth distribution interval is −2.8 to −1.39V.

It can be concluded from the above experiments that the present disclosure has the effect of negatively shifting the threshold voltage of the P-type TFT, and the maximum value of the threshold voltage of the P-type TFT can be reduced from −1V to −1.3V, when being compared with the prior art. Therefore, the present disclosure may also achieve the effect of reducing the threshold voltage of the N-type TFT.

With respect to the manufacturing method of the LTPS TFT substrate, after the gate insulation layer 40 is formed, the gate insulation layer 40 is doped with a nitrogen-containing plasma to increase the positive charge in the gate insulation layer 40. Therefore, the P-type TFT threshold voltage can be negatively shifted, and the maximum value of the P-type TFT threshold voltage can be reduced from −1 V to −1.3 V, when being compared with the prior art, thereby improving the splash screen issue.

FIG. 4 is a schematic view showing the step S3 of the manufacturing method of the LTPS TFT substrate and the structure of the LTPS TFT substrate in accordance with one embodiment of the present disclosure. The LTPS TFT substrate includes a base substrate base substrate 10, a polysilicon active layer 30 on the base substrate 10, a gate insulation layer 40 on the base substrate 10, and a gate 20 and a source/drain 50 on the gate insulation layer 40, wherein the gate insulation layer 40 covers the polysilicon active layer 30.

The gate insulation layer 40 of the silicon oxide layer is subjected to the nitrogen doping process.

In an embodiment, the gate insulation layer 40 is a silicon oxide layer.

In an embodiment, the polysilicon active layer 30 is subjected to the P-type doping process. The through holes 45 are formed on the gate insulation layer 40, wherein the through holes 45 corresponds to tops of two ends of the polysilicon active layer 30. The source/drain 50 contact with the polysilicon active layer 30 via the through holes 45.

After the gate insulation layer 40 is applied with the nitrogen doping process, the threshold voltage of the P-type TFT may be negatively shifted, and the maximum value of the threshold voltage of the P-type TFT can be reduced from −1V to −1.3V, when being compared with the prior art. Therefore, the present disclosure may also enhance the splash screen issue.

In view of the above, after the gate insulation layer is formed, the gate insulation layer is doped with nitrogen by a plasma containing nitrogen so as to increase the positive charges within the gate insulation layer. As such, the P-type TFT threshold voltage can be negatively shifted. Compared with the convention technology, the maximum value of the P-type TFT threshold voltage can be reduced from −1 V to −1.3 V, thereby improving the splash screen issue. With respect to the LTPS TFT substrate, the gate insulation layer is subjected to the nitrogen-doping process, thereby enabling the P-type TFT threshold voltage to be negatively shifted, and the maximum value of the P-type TFT threshold voltage can be reduced from −1 V to −1.3 V, when being compared to the conventional technology. In turn, the splash screen issue of the display panel can be improved.

Above are embodiments of the present invention, which does not limit the scope of the present invention. Any equivalent amendments within the spirit and principles of the embodiment described above should be covered by the protected scope of the invention.

What is claimed is:

1. A manufacturing method of Low Temperature Polysilicon (LTPS) thin film transistor (TFT) substrates, comprising:
    S1: providing a base substrate, and forming a polysilicon active layer on the base substrate;
    S2: depositing a gate insulation layer on the base substrate and applying a nitrogen doping process using nitrogen-containing plasma toward the gate insulation layer, wherein the gate insulation layer covers the polysilicon active layer; and
    S3: forming a gate and a source/drain on the gate insulation layer,
    wherein the gate insulation layer is doped with nitrogen to increase positive charges of the gate insulation layer so as to reduce a threshold voltage of a thin film transistor formed of the polysilicon active layer, the nitrogen-doped gate insulation layer, and the gate and the source/drain.

2. The manufacturing method as claimed in claim 1, wherein the gate insulation layer is a silicon oxide layer.

3. The manufacturing method as claimed in claim 1, wherein in the step S2, at least one of ammonia ($NH_3$), nitrogen ($N_2$), and nitrous oxide ($NO_2$) is selected as a reactive gas in a Plasma Enhanced Chemical Vapor Deposition (PECVD) device so as to produce the nitrogen-containing plasma for the nitrogen doping process being applied to the gate insulation layer; and
    an electric power used by the PECVD device to perform the nitrogen doping process on the polysilicon active layer is in a range from 2000 to 10000 w, and the nitrogen doping process is applied to the gate insulation layer for a time period ranging from 10 to 120 seconds.

4. The manufacturing method as claimed in claim 3, wherein in the step S2, the ammonia ($NH_3$) is selected as the reactive gas in the PECVD device so as to produce the nitrogen-containing plasma; and
    the electric power used by the PECVD device to perform the nitrogen doping process on the polysilicon active layer is in a range from 6000 to 8000 w, and the nitrogen doping process is applied to the gate insulation layer for the time period ranging from 40 to 70 seconds.

5. The manufacturing method as claimed in claim 1, wherein before forming the source/drain, the step S3 further comprises:
    forming through holes on the gate insulation layer, wherein the through holes corresponds to tops of two ends of the polysilicon active layer, and after the source/drain is formed, the source/drain contact with the polysilicon active layer via the through holes.

6. The manufacturing method as claimed in claim 1, wherein the step S1 or the step S3 further comprises:
    applying a P-type ion doping to the polysilicon active layer.

7. The manufacturing method as claimed in claim 6, wherein the ions doped during the P-type ion doping are boron ions.

8. A LTPS TFT substrate, comprising:
    a base substrate, a polysilicon active layer on the base substrate, a gate insulation layer on the base substrate, and a gate and a source/drain on the gate insulation layer, wherein the gate insulation layer covers the polysilicon active layer; and the gate insulation layer being applied with a nitrogen doping process, wherein the gate insulation layer is doped with nitrogen to increase positive charges of the gate insulation layer so as to reduce a threshold voltage of a thin film transistor formed of the polysilicon active layer, the nitrogen-doped gate insulation layer, and the gate and the source/drain.

9. The LTPS TFT substrate as claimed in claim 8, wherein the gate insulation layer is a silicon oxide layer.

10. The LTPS TFT substrate as claimed in claim 8, wherein a P-type ion doping is applied to the polysilicon active layer;

through holes corresponds to tops of two ends of the polysilicon active layer are configured on the gate insulation layer, and the source/drain contact with the polysilicon active layer via the through holes.

\* \* \* \* \*